US010373869B2

(12) United States Patent
Grivna et al.

(10) Patent No.: US 10,373,869 B2
(45) Date of Patent: Aug. 6, 2019

(54) METHOD OF SEPARATING A BACK LAYER ON A SUBSTRATE USING EXPOSURE TO REDUCED TEMPERATURE AND RELATED APPARATUS

(71) Applicant: SEMICONDUCTOR COMPONENTS INDUSTRIES, LLC, Phoenix, AZ (US)

(72) Inventors: Gordon M. Grivna, Mesa, AZ (US); Hou Nion Chan, Ipoh (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/938,115

(22) Filed: Mar. 28, 2018

(65) Prior Publication Data

US 2018/0342423 A1 Nov. 29, 2018

Related U.S. Application Data

(60) Provisional application No. 62/510,538, filed on May 24, 2017.

(51) Int. Cl.
*H01L 21/78* (2006.01)
*H01L 21/683* (2006.01)
*H01L 21/324* (2006.01)

(52) U.S. Cl.
CPC ............ *H01L 21/78* (2013.01); *H01L 21/324* (2013.01); *H01L 21/6835* (2013.01)

(58) Field of Classification Search
None
See application file for complete search history.

(56) References Cited

U.S. PATENT DOCUMENTS 4,820,377 A 4/1989 Davis et al.
5,075,253 A 12/1991 Sliwa, Jr.
(Continued)

FOREIGN PATENT DOCUMENTS

EP 1873824 A1 1/2008
WO 2001056063 A2 8/2001
(Continued)

OTHER PUBLICATIONS

European Patent Office, Search Report for EP Application No. 13181098.8, dated Nov. 3, 2014, 5 pages.
(Continued)

*Primary Examiner* — Asok K Sarkar
(74) *Attorney, Agent, or Firm* — Kevin B. Jackson (57) ABSTRACT

A method of processing a substrate includes providing a substrate having die formed as part of the substrate and separated from each other by spaces, wherein the substrate has first and second opposing major surfaces, and wherein a layer of material is formed atop the second major surface. The method includes placing the substrate onto a carrier substrate and removing portions of the substrate through the spaces to form gaps between adjoining die. The gaps extend at least partially through the substrate towards the second major surface. The method includes exposing the layer of material to a reduced temperature while the substrate is constrained in a first direction between a plate structure and a support structure, wherein the exposing step expands the gaps between the adjoining die in a second direction to separate at least portions of the layer of material. The method provides a reliable and efficient way to bulk separate at least the layer of material.

20 Claims, 10 Drawing Sheets

(56) References Cited

U.S. PATENT DOCUMENTS

| | | |
|---|---|---|
| 5,166,097 A | 11/1992 | Tanielian |
| 5,401,690 A | 3/1995 | Chen |
| 5,510,655 A | 4/1996 | Tanielian |
| 5,753,418 A | 5/1998 | Tsai et al. |
| 5,856,705 A | 1/1999 | Ting |
| 5,863,813 A | 1/1999 | Dando |
| 5,919,713 A | 7/1999 | Ishii et al. |
| 6,030,885 A | 2/2000 | Bothra |
| 6,140,151 A | 10/2000 | Akram |
| 6,165,814 A | 12/2000 | Wark et al. |
| 6,200,851 B1 | 3/2001 | Arnold |
| 6,214,703 B1 | 4/2001 | Chen et al. |
| 6,342,724 B1 | 1/2002 | Wark et al. |
| 6,406,979 B2 | 6/2002 | Fischer et al. |
| 6,563,204 B1 | 5/2003 | Glenn |
| 6,642,127 B2 | 11/2003 | Kumar et al. |
| 6,686,225 B2 | 2/2004 | Wachtler |
| 6,897,128 B2 | 5/2005 | Arita |
| 6,969,669 B2 | 11/2005 | Arita |
| 7,060,531 B2 | 6/2006 | Arita |
| 7,098,077 B2 | 8/2006 | Huang et al. |
| 7,129,114 B2 | 10/2006 | Akram |
| 7,253,477 B2 | 8/2007 | Loechelt et al. |
| 7,309,623 B2 | 12/2007 | Tan et al. |
| 7,335,576 B2 | 2/2008 | David et al. |
| 7,488,668 B2 | 2/2009 | Arita et al. |
| 7,629,228 B2 | 12/2009 | Haji et al. |
| 7,651,925 B2 | 1/2010 | Wyant |
| 7,678,670 B2 | 3/2010 | Arita et al. |
| 7,705,420 B2 | 4/2010 | Joodaki |
| 7,767,551 B2 | 8/2010 | Arita et al. |
| 7,781,310 B2 | 8/2010 | Grivna |
| 7,846,848 B2 | 12/2010 | Lewington et al. |
| 7,883,343 B1 | 2/2011 | Mulligan et al. |
| 7,906,410 B2 | 3/2011 | Arita et al. |
| 7,915,140 B2 | 3/2011 | Genda et al. |
| 7,923,349 B2 | 4/2011 | McElrea et al. |
| 7,985,661 B2 | 7/2011 | Grivna |
| 7,989,319 B2 | 8/2011 | Grivna et al. |
| 8,012,857 B2 | 9/2011 | Grivna et al. |
| 8,178,372 B2 | 5/2012 | Lutgen et al. |
| 8,384,231 B2 | 2/2013 | Grivna et al. |
| 8,450,188 B1 | 5/2013 | Lindsey |
| 8,587,130 B2 | 11/2013 | Hamasaki et al. |
| 8,664,089 B1 | 3/2014 | Burghout et al. |
| 8,691,666 B2 | 4/2014 | Segawa et al. |
| 8,906,745 B1 | 12/2014 | Lindsey |
| 9,034,733 B2 | 5/2015 | Burghout et al. |
| 9,136,173 B2 | 9/2015 | Grivna |
| 9,153,493 B1 | 10/2015 | Lindsey |
| 9,418,894 B2 | 8/2016 | Grivna |
| 9,484,210 B2 | 11/2016 | Burghout et al. |
| 9,484,260 B2 | 11/2016 | Grivna |
| 9,564,365 B2 | 2/2017 | Grivna |
| 9,589,844 B2 | 3/2017 | Grivna |
| 9,773,689 B2 | 9/2017 | Grivna |
| 9,847,219 B2 | 12/2017 | Burghout et al. |
| 9,917,013 B2 | 3/2018 | Grivna |
| 2001/0000079 A1 | 3/2001 | Usami et al. |
| 2003/0207579 A1 | 11/2003 | Rattner et al. |
| 2003/0235937 A1 | 12/2003 | Mong et al. |
| 2004/0087065 A1 | 5/2004 | Udrea et al. |
| 2004/0102025 A1 | 5/2004 | Arita |
| 2004/0185580 A1 | 9/2004 | Goh |
| 2005/0072766 A1 | 4/2005 | Arita |
| 2005/0084996 A1 | 4/2005 | Harper |
| 2005/0104165 A1 | 5/2005 | Ishio et al. |
| 2005/0142863 A1 | 6/2005 | Spandre |
| 2005/0196940 A1 | 9/2005 | Yajima et al. |
| 2006/0001130 A1 | 1/2006 | Islam et al. |
| 2006/0030078 A1 | 2/2006 | Jiang et al. |
| 2006/0115962 A1 | 6/2006 | Maeda |
| 2006/0118515 A1 | 6/2006 | Dolechek et al. |
| 2006/0141677 A1 | 6/2006 | Munakata et al. |
| 2006/0143908 A1 | 7/2006 | Duchesne et al. |
| 2006/0154401 A1 | 7/2006 | Gardner et al. |
| 2006/0166466 A1 | 7/2006 | Maki et al. |
| 2006/0244096 A1 | 11/2006 | Sekiya |
| 2006/0278956 A1 | 12/2006 | Cadouri |
| 2007/0087524 A1 | 4/2007 | Montgomery |
| 2007/0111476 A1 | 5/2007 | Sugiura et al. |
| 2007/0132034 A1 | 6/2007 | Curello et al. |
| 2007/0148807 A1 | 6/2007 | Akram |
| 2007/0249178 A1 | 10/2007 | Ogihara |
| 2007/0264832 A1 | 11/2007 | Arita et al. |
| 2008/0099900 A1 | 5/2008 | Oganesian et al. |
| 2008/0190902 A1 | 8/2008 | Nakamura |
| 2009/0001609 A1 | 1/2009 | Lim |
| 2009/0057838 A1 | 3/2009 | Arita et al. |
| 2009/0061595 A1 | 3/2009 | Weber et al. |
| 2009/0065904 A1 | 3/2009 | Wang |
| 2009/0075459 A1 | 3/2009 | Sato et al. |
| 2009/0191690 A1 | 7/2009 | Boyle et al. |
| 2009/0209087 A1 | 8/2009 | Arita |
| 2009/0263927 A1 | 10/2009 | Lin et al. |
| 2010/0029059 A1 | 2/2010 | Matsumura et al. |
| 2010/0029061 A1 | 2/2010 | Kamiya et al. |
| 2010/0048001 A1 | 2/2010 | Harikai et al. |
| 2010/0055875 A1 | 3/2010 | Haji et al. |
| 2010/0120227 A1 | 5/2010 | Grivna et al. |
| 2010/0129985 A1 | 5/2010 | Ootake et al. |
| 2010/0129986 A1 | 5/2010 | Kamiya et al. |
| 2010/0129988 A1 | 5/2010 | Ootake et al. |
| 2010/0129989 A1 | 5/2010 | Kamiya et al. |
| 2010/0173474 A1 | 7/2010 | Arita et al. |
| 2010/0197115 A1 | 8/2010 | Arita et al. |
| 2010/0227454 A1 | 9/2010 | Dohmae |
| 2010/0240196 A1 | 9/2010 | Saito et al. |
| 2010/0248451 A1 | 9/2010 | Pirogovsky et al. |
| 2010/0261336 A1 | 10/2010 | Morita |
| 2010/0279491 A1 | 11/2010 | Kiuchi et al. |
| 2010/0311226 A1 | 12/2010 | Hamasaki et al. |
| 2010/0311227 A1 | 12/2010 | Hatakeyama et al. |
| 2010/0314781 A1 | 12/2010 | Hayashi et al. |
| 2011/0053346 A1 | 3/2011 | Matsumura et al. |
| 2011/0124180 A1 | 5/2011 | Abe et al. |
| 2011/0124181 A1 | 5/2011 | Suzuki et al. |
| 2011/0175209 A1 | 7/2011 | Seddon et al. |
| 2011/0175225 A1 | 7/2011 | Seddon et al. |
| 2011/0175242 A1 | 7/2011 | Grivna et al. |
| 2011/0177675 A1 | 7/2011 | Grivna et al. |
| 2011/0189835 A1 | 8/2011 | Sugo et al. |
| 2011/0237050 A1 | 9/2011 | Sugimura et al. |
| 2011/0244657 A1 | 10/2011 | Grivna et al. |
| 2011/0287609 A1 | 11/2011 | Kobayashi |
| 2011/0294279 A1 | 12/2011 | Okamura |
| 2011/0318879 A1 | 12/2011 | Hatakeyama et al. |
| 2012/0028415 A1 | 2/2012 | Shiga et al. |
| 2012/0061805 A1 | 3/2012 | Amano et al. |
| 2012/0068312 A1 | 3/2012 | Tanaka et al. |
| 2012/0070960 A1 | 3/2012 | Murata et al. |
| 2012/0238073 A1 | 9/2012 | Johnson et al. |
| 2012/0244681 A1 | 9/2012 | Grivna et al. |
| 2012/0309170 A1 | 12/2012 | Hayashishita et al. |
| 2012/0322231 A1 | 12/2012 | Kim et al. |
| 2012/0329250 A1 | 12/2012 | Oda et al. |
| 2013/0040426 A1 | 2/2013 | Narita |
| 2013/0095639 A1 | 4/2013 | Takamoto et al. |
| 2013/0122688 A1 | 5/2013 | Sasaki et al. |
| 2013/0157415 A1 | 6/2013 | Morita et al. |
| 2013/0164914 A1 | 6/2013 | Sekiya |
| 2013/0178006 A1 | 7/2013 | Kim et al. |
| 2013/0230973 A1 | 9/2013 | Gauldin et al. |
| 2013/0264686 A1 | 10/2013 | Shoichi et al. |
| 2013/0330910 A1 | 12/2013 | Tanaka et al. |
| 2014/0057411 A1 | 2/2014 | Hoang et al. |
| 2014/0127880 A1 | 5/2014 | Grivna |
| 2014/0159254 A1 | 6/2014 | Takamoto et al. |
| 2016/0372323 A1* | 12/2016 | Doub ............... H01L 21/67092 |
| 2017/0103922 A1 | 4/2017 | Grivna |
| 2017/0352593 A1* | 12/2017 | Grivna ............... H01L 21/6836 |
| 2018/0158734 A1* | 6/2018 | Grivna ............... H01L 21/78 |
| 2018/0269104 A1* | 9/2018 | Grivna ............... H01L 21/78 |

(56) References Cited

U.S. PATENT DOCUMENTS

FOREIGN PATENT DOCUMENTS

| WO | 2001056063 A3 | 8/2001 |
|---|---|---|
| WO | 2004066382 A1 | 8/2004 |
| WO | 2007007883 A1 | 1/2007 |
| WO | PCT/JP2007/066960 | 8/2007 |
| WO | 2008081968 A1 | 7/2008 |
| WO | 200963620 A1 | 5/2009 |
| WO | 2014052445 A1 | 4/2014 |

OTHER PUBLICATIONS

On Semiconductor and Micro Processing Technology, Inc.; Petition to Correct Inventorship of a Patent and Request for Certificate of Correction Under 37 CFR 1.324; filed Nov. 21, 2017 with the USPTO for U.S. Pat. No. 8,906,745 to add inventor Gordon M. Grivna.

Earl N. Taylor, Examiner, United States Patent and Trademark Office, "Petition Decision", dated Feb. 1, 2018.

Gordon M. Grivna, "Method of Separating Electronic Devices Having a Back Layer and Apparatus", U.S. Appl. No. 15/874,307, filed Jan. 18, 2018.

\* cited by examiner

METHOD OF SEPARATING A BACK LAYER ON A SUBSTRATE USING EXPOSURE TO REDUCED TEMPERATURE AND RELATED APPARATUS

CROSS REFERENCE TO RELATED APPLICATION

This application claims priority to U.S. Provisional Application No. 62/510,538 filed on May 24, 2017, the content of which is hereby incorporated by reference.

BACKGROUND

The present description relates, in general, to electronics and, more particularly, to methods for forming electronic devices such as semiconductor dies having one or more back layers disposed atop surfaces thereof.

In the past, the electronics industry utilized various methods and equipment to singulate individual semiconductor die from a semiconductor wafer on which the die were manufactured. Typically, a technique called scribing or dicing was used to either partially or fully cut through the wafer with a diamond cutting wheel along scribe grids or singulation lines that were formed on the wafer between the individual die. To allow for the alignment and the width of the dicing wheel each scribe grid usually had a large width, generally about one hundred fifty (150) microns, which consumed a large portion of the semiconductor wafer. Additionally, the time required to scribe each singulation line on the semiconductor wafer could take over one hour or more. This time reduced the throughput and manufacturing capacity of a production facility.

Other methods, which have included thermal laser separation (TLS), laser ablation dicing, and plasma dicing, have been explored as alternatives to scribing. Plasma dicing is a promising process compared to scribing and other alternative processes because it supports narrower scribe lines, has increased throughput, and can singulate die in varied and flexible patterns. However, plasma dicing has had manufacturing implementation challenges. Such challenges have included non-compatibility with wafer backside layers, such as back metal layers, because the etch process has been unable to effectively remove or separate the backside layers from the singulation lines. Removing or separating the backside layers from the scribe lines is necessary to facilitate subsequent processing, such as pick-and-place and assembly processes.

Accordingly, it is desirable to have a method of and apparatus for singulating or separating the backside layers adjacent to the singulation lines of wafers. It would be beneficial for the method to be cost effective and to minimize any damage to or contamination of the separated die. Further, it would be beneficial if the method and apparatus could also separate or singulate partially separated die on wafers.

For simplicity and clarity of the illustration, elements in the figures are not necessarily drawn to scale, and the same reference numbers in different figures denote the same elements. Additionally, descriptions and details of well-known steps and elements are omitted for simplicity of the description. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor material. The major surface can have a topography that changes in the x, y and z directions. As used herein, the term and/or includes any and all combinations of one or more of the associated listed items. In addition, the terminology used herein is for the purpose of describing particular examples only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the examples illustrated and described hereinafter suitably may have examples and/or may be practiced in the absence of any element that is not specifically disclosed herein.

DETAILED DESCRIPTION OF THE DRAWINGS

The present description includes, among other features, a method for processing a substrate having gaps disposed between adjoining die formed as part of the substrate, which includes batch separating, breaking, or singulating a layer of material disposed atop a surface of the substrate. In some examples, the layer of material is exposed to a reduced temperature while being constrained in one direction such that the substrate expands in another direction to increase the width of the gaps thereby separating the back layer. In other examples, portions of the substrate can also be separated in a similar manner. The method and associated apparatus provide a process for batch separating a whole substrate in a cost effective manner. In addition, the method and associated apparatus enable batch separation for more challenging types of back layer materials, such as wafer-back-coating materials (WBC), thick metal layers (e.g., greater than 20 microns thick), and die attach films (DAF) among others. Further, the method and associated apparatus support narrower scribe grids, support partial singulation methods, reduce the present of back layer fillet structures, and support a variety of substrate materials including, for example, silicon carbide substrates.

More particularly, in one example, a method of processing a substrate includes providing a substrate having die formed as part of the substrate and separated from each other by spaces, wherein the substrate has first and second opposing major surfaces, and wherein a layer of material is formed atop the second major surface. The method includes placing the substrate onto a carrier substrate and removing portions of the substrate through the spaces to form gaps between adjoining die. The gaps extend at least partially through the substrate towards the second major surface. The method includes exposing the layer of material to a reduced temperature while the substrate is constrained in a first direction between a plate structure and a support structure, wherein the exposing step expands the gaps between the adjoining die in a second direction to separate at least portions of the layer of material. In another example, the exposing step comprises exposing using a cryogenic fluid.

In a further example, a method of processing a substrate includes providing a substrate having die formed as part of the substrate and separated from each other by spaces, wherein the substrate has first and second opposing major surfaces, and wherein a layer of material is formed atop the second major surface. The method includes placing the substrate onto a carrier substrate and removing portions of the substrate through the spaces to form gaps between adjoining die, wherein the gaps extend at least partially through the substrate towards the second major surface. The method includes exposing the layer of material to a reduced temperature while the substrate is constrained in a first direction, wherein the exposing step expands the gaps between the adjoining die in a second direction to separate at least portions of the layer of material. In a still further example, providing the substrate can comprise providing a semiconductor wafer. In another example, providing the layer of material can include providing the layer of material comprising a metal.

In another example, a method of processing a substrate comprises providing a substrate having die formed as part of the substrate and separated from each other by spaces, wherein the substrate comprises first and second opposing major surfaces, and wherein a layer of material is formed atop the second major surface. The method includes placing the substrate onto a carrier substrate and removing at least portions of the substrate within the spaces to form gaps between adjoining die. The method includes providing an apparatus comprising a plate structure and a support structure including a recess. The method includes exposing the layer of material to a reduced temperature using a cryogenic fluid while the substrate is constrained in a first direction between the plate structure and the support structure, wherein the exposing step expands the gaps between the adjoining die in a second direction to separate at least portions of the layer of material. In a further example, the method can further include providing a thermal transfer medium within the recess and exposing the thermal transfer medium to the reduced temperature thereby transitioning the thermal transfer medium from a first state to a second state. In a still further example, providing the thermal transfer medium can comprise providing a liquid, and exposing can comprise freezing the liquid.

Other examples are included in the present disclosure. Such examples may be found in the figures, in the claims, and/or in the description of the present disclosure.

Figure 1:
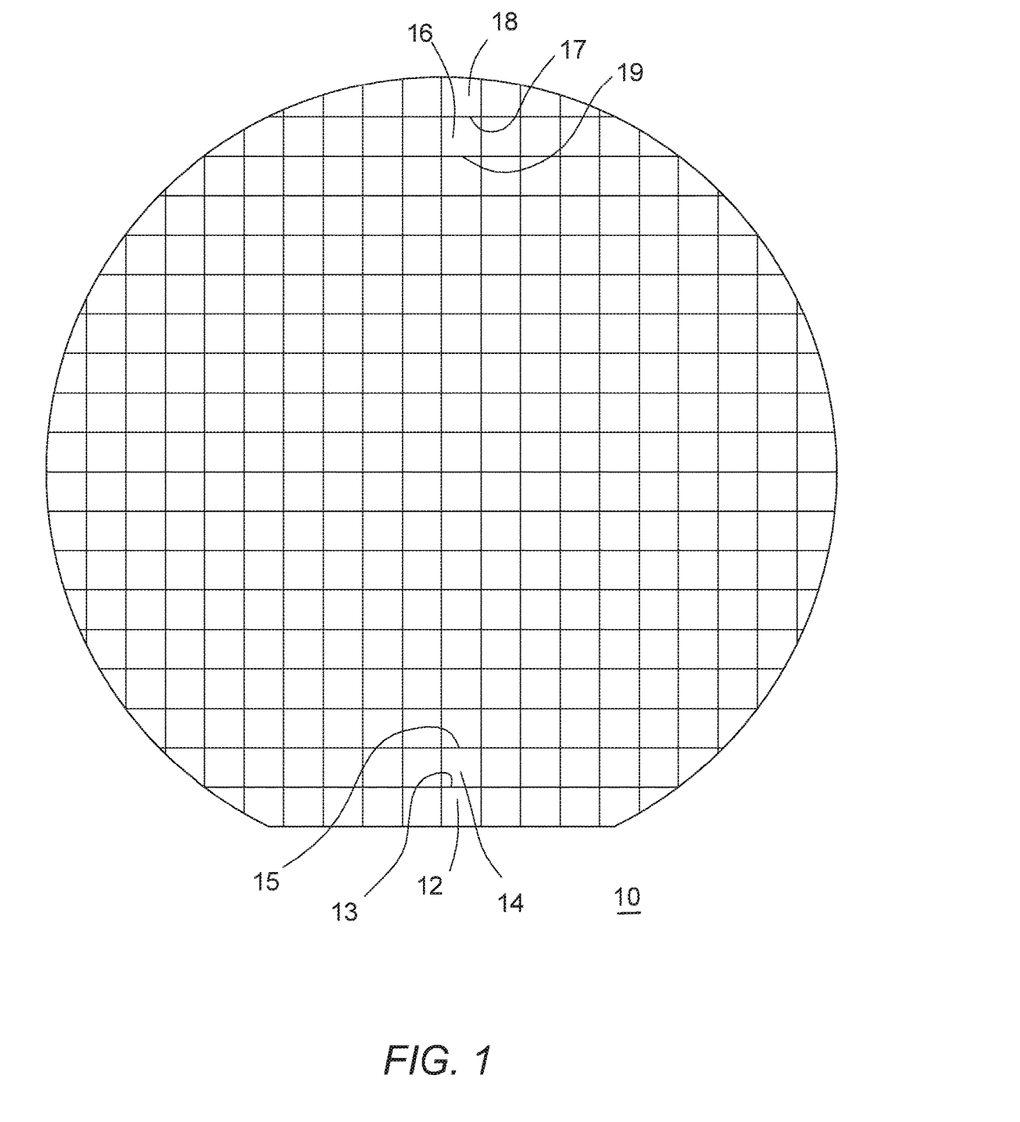
FIG. 1 illustrates a reduced plan view of an example of a wafer in accordance with the present description.

FIG. 1 is a reduced plan view that graphically illustrates a view of a work piece 10, substrate 10, or wafer 10 at a later step in fabrication. In one example, wafer 10 can be a body of semiconductor material, such as a semiconductor substrate or a semiconductor wafer. Wafer 10 includes a plurality of semiconductor die, such as die 12, 14, 16, and 18, that are formed on or as part of semiconductor wafer 10. Die 12, 14, 16, and 18 are spaced apart from each other on wafer 10 by spaces in which singulation lines or gaps are to be formed or defined, such as scribe lines, singulation lines, or gaps 13, 15, 17, and 19. As is known by those skilled in the art, all of the semiconductor die on wafer 10 generally are separated from each other on all sides by areas or spaces where scribe lines, gaps, or singulation lines, such as singulation lines 13, 15, 17, and 19 are to be formed. It is understood that in some examples, the singulation lines or gaps between adjoining die may have other shapes. Die 12, 14, 16, and 18 can be any kind of electronic device including semiconductor devices such as, diodes, transistors, discrete devices, integrated circuits, sensor devices, optical devices, or other devices known to one of ordinary skill in the art. Die 12, 14, 16, and 18 can be any shape and do not have to be the same shape. In one example, wafer 10 has completed wafer processing including the formation of a backside layer or back layer of material described later.

Figure 2:
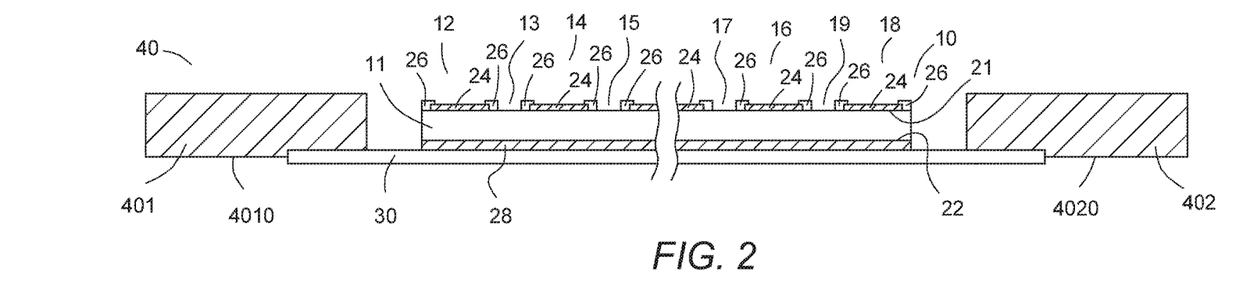
FIG. 2 illustrates a cross-sectional view of the wafer of FIG. 1 mounted to a carrier substrate in accordance with an example of the present description.

FIG. 2 illustrates an enlarged cross-sectional view of wafer 10 at an early step in a die singulation method in accordance with an example. In one example, wafer 10 is attached to a carrier substrate 30, transfer tape 30, or carrier tape 30 that facilitates supporting the plurality of die on wafer 10 after the die are singulated or separated into individual die. Such carrier tapes are well known to those of skill in the art. In some examples, carrier substrate 30 includes an adhesive layer or portion atop a backing layer.

In one example, carrier tape 30 can be attached to a support structure 40 or frame 40, which can include frame portions or portions 401 and 402. In some examples, frame 40 is made of a rigid material, such as stainless steel. As illustrated in FIG. 2, carrier tape 30 can be attached to surface 4010 of frame portion 401 and to surface 4020 of frame portion 402 using, for example, the adhesive portion of carrier tape 30. In other examples, carrier tape 30 can be attached to an opposite side of frame 40. It is understood that other support structures can be used with carrier substrate 30 as well as those used in addition to frame 40.

In some examples, wafer 10 can include a bulk substrate 11, such as a silicon substrate, which can include opposing major surfaces 21 and 22. Bulk substrate 11 can be of various diameters, with 100 millimeter (mm), 150 mm, 200 mm, 300 mm, and 450 mm being examples. Bulk substrate 11 can have thickness in a range from about 300 microns to about 500 microns or greater depending on the application and diameter. In other examples, bulk substrate 11 can comprise other semiconductor materials such as heterojunction semiconductor materials or bulk substrate 11 can be an insulating material such as ceramic materials. In one example, bulk substrate 11 comprises silicon. In another example, bulk substrate 11 comprises silicon carbide. In further examples, bulk substrate 11 comprises gallium nitride, silicon-germanium, any III-IV materials, and/or any IV-IV materials.

In one example, contact pads 24 can be formed along, in, on, partially in, partially on, or above portions of major surface 21 to provide for electrical contact between structures formed within bulk substrate 11 and next levels of assembly or external elements. For example, contact pads 24 can be formed to receive bonding wires or clips that subsequently may be attached to contact pads 24, or contact pads 24 can be formed to receive a solder ball, bump or other type of attachment structure. Contact pads 24 generally can be one or more metals or other conductive material(s). It is understood that multiple contact pads 24 can be provided for each die.

In some examples, a dielectric material 26 such as, a blanket deposited dielectric layer can be formed on or overlying major surface 21 to function as a passivation layer for wafer 10. In one example, dielectric material 26 can be a material that etches at a slower rate than that of bulk substrate 11. In one example, dielectric material 26 can be a silicon oxide, silicon nitride, or polyimide when substrate 11 is silicon. It should also be noted that a separate polymer protective layer, such as a patterned protective layer, can be used to protect the areas not intended to be etched during subsequent processing. In one example, the patterned protective layer can be a patterned photoresist layer. An example of such a protective layer is noted as element 35 in FIG. 4 described later. Other types of protective material can be used.

In one example, openings can be formed in dielectric material 26 (and other dielectric layers that can be formed above or below dielectric material 26) to expose underlying surfaces of contact pads 24 and surfaces of substrate 11 where singulation lines 13, 15, 17, and 19 are to be formed. In one example, the patterned photoresist layer describes previously can be used to form the openings with an etch process or other removal process. As illustrated in FIG. 2 and in accordance with the present example, wafer 10 further includes a layer of material 28 or layer 28 formed atop, on or overlying major surface 22 of wafer 10. More particularly, layer of material 28 is other than bulk substrate 11. In some examples, layer of material 28 comprises a continuous and non-patterned layer as illustrated in FIG. 2.

In one example, layer of material 28 can be a conductive back metal structure comprising one or more metals. Layer of material 28 can be any suitable material appropriate for electronic technology. In some examples, layer of material 28 comprises a conductive material. In one example, layer of material 28 can be a multi-layer metal system such as, titanium/nickel/silver, titanium/nickel/silver/tungsten, chrome/nickel/gold, copper, copper alloys, gold, or other materials known to those skilled in the art. In some examples, layer 28 is greater than about one micron in thickness. In other examples, layer 28 is greater than about two microns in thickness. In still other examples, layer 28 is greater than about three microns in thickness. In another example, layer 28 can be a wafer backside coating (WBC) film, such as a die-attach coating or film (DAF), which can be electrically and thermally conductive, thermally conductive, or insulating. In one example, layer 28 can be formed having or provided with recesses, gaps, spaces, or channels between at least some adjacent die. In a further example, the gaps are substantially aligned with corresponding spaces on the opposite side of wafer 10 where singulation lines 13, 15, 17, 19 will be formed. In another example, layer 28 is separated from the edges of least some of the die. Stated differently, layer 28 may have a non-planar surface distal to major surface 22 of bulk substrate 11.

Figure 3:
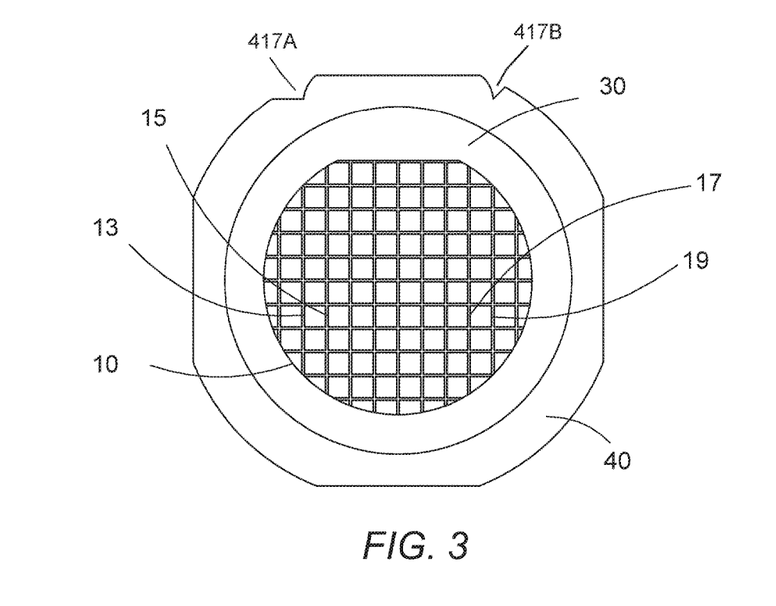
FIG. 3 illustrates a top view of the example of FIG. 2.

FIG. 3 illustrates a top view of wafer 10 in accordance with the cross-sectional view of FIG. 2 after wafer 10 is mounted on carrier tape 30 with layer 28 demountably fixed, disposed against, or adjoining carrier tape 30. In one example, carrier tape 30 is mounted to frame 40. As illustrated in FIG. 3, frame 40 can be configured with alignment portions or notches 417A and 417B to better assist placing frame 40 into processing equipment such as the equipment described herein.

Figure 4:
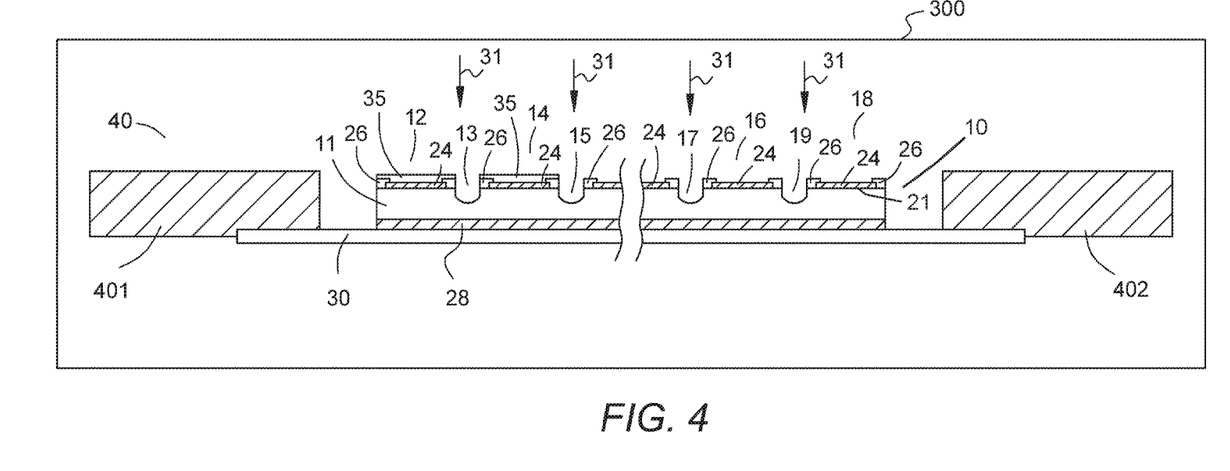
FIGS. 4-5 illustrate partial cross-sectional views of the wafer of FIG. 1 at various stages in a process of singulating die from the wafer in accordance with an example of the present description.

FIG. 4 illustrates an enlarged cross-sectional view of wafer 10 at a subsequent step during a singulation process in accordance with the present example. In FIG. 4, a plasma or dry etch singulation process is illustrated. It is understood that other singulation processes can be used. In one example, wafer 10 mounted onto or affixed to carrier tape 30 or film 30 is then placed within an etch apparatus 300, such as a plasma etching apparatus. In one example, wafer 10 can be etched through the openings to form or define singulation lines or openings 13, 15, 17, and 19 extending generally inward from major surface 21. The etching process can be performed using a chemistry (generally represented as arrows 31) that selectively etches silicon or the material of bulk substrate 11 at a much higher rate than that of dielectrics and/or metals, such as dielectric material 26 and contact pads 24.

Figure 5:
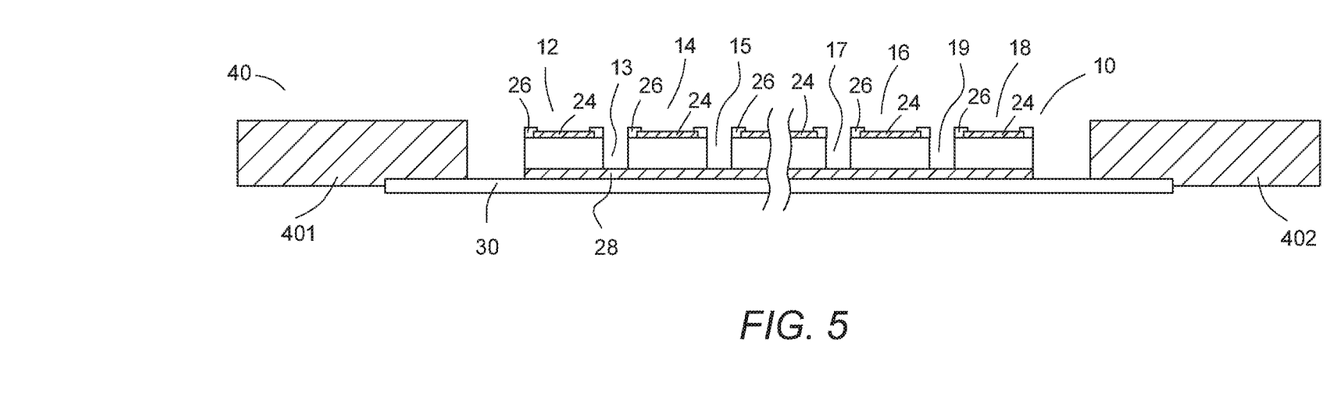

In one example, wafer 10 can be etched using a process commonly referred to as the Bosch process. In one example, wafer 10 can be etched using the Bosch process in a deep reactive ion etch system. In some examples, the width of singulation lines 13, 15, 17, and 19 can be in a range from about five microns to about twenty microns. Such a width is sufficient to ensure that the openings that form singulation lines 13, 15, 17, and 19 can be formed completely through bulk substrate 11 stopping proximate to or on layer 28 because of the etch selectivity as generally illustrated in FIG. 5. In one example, layer 28 can be used as a stop layer for the plasma etch singulation process. In one example, singulation lines 13, 15, 17, and 19 can be formed in about five to about thirty minutes using the Bosch process. A suitable etch apparatus is available from Plasma-Therm LLC of St.

Figure 6A:
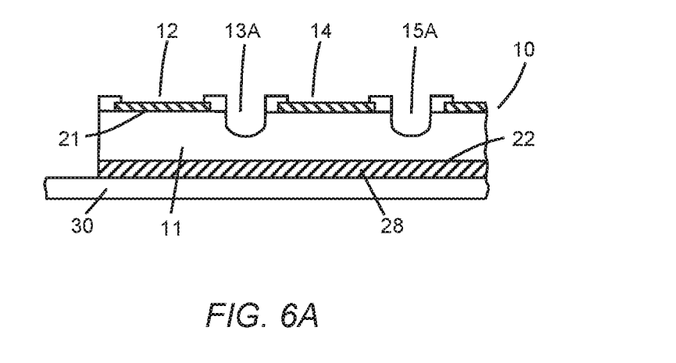
FIGS. 6A, 6B, and 6C illustrate partial cross-sectional views of a wafer after partially singulating die from the wafer in accordance with alternative examples of the present description.
Figure 6B:
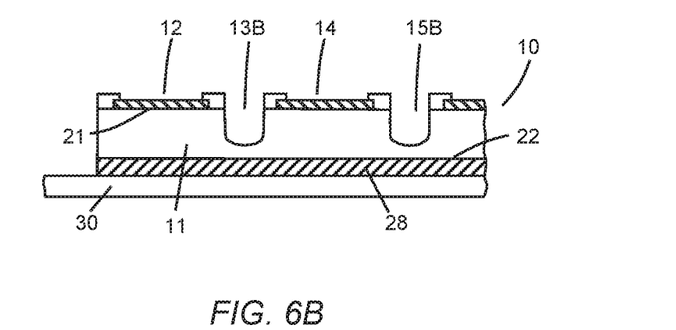
Figure 6C:
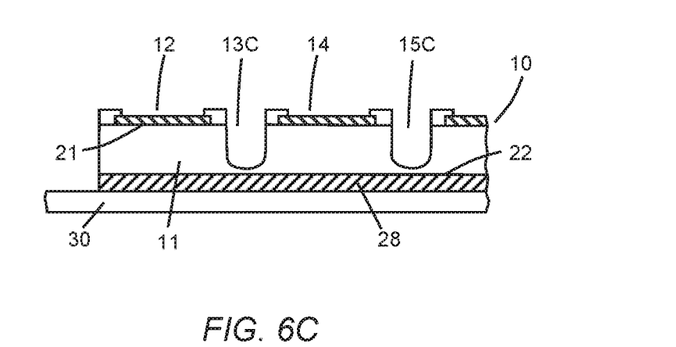

Petersburg, Fla., U.S.A. In other examples, the singulation process can be terminated before singulation lines 13, 15, 17, and 19 extend completely through bulk substrate 11 so that a portion of bulk substrate 11 remains between back layer 28 and lower surfaces of singulation lines 13, 15, 17, and 19. In some examples, at least 50% of bulk substrate 11 is removed in singulation lines 13, 15, 17, and 19 (see for example, singulation lines 13A and 15A in FIG. 6A); in other examples, at least 75% of bulk substrate is removed in singulation lines 13, 15, 17, and 19 (see for example, singulation lines 13B and 15B in FIG. 6B); and in further examples, at least 90% of bulk substrate 11 is removed in singulation lines 13, 15, 17, and 19 (see for example, singulation lines 13C and 15C in FIG. 6C).

Figure 7:
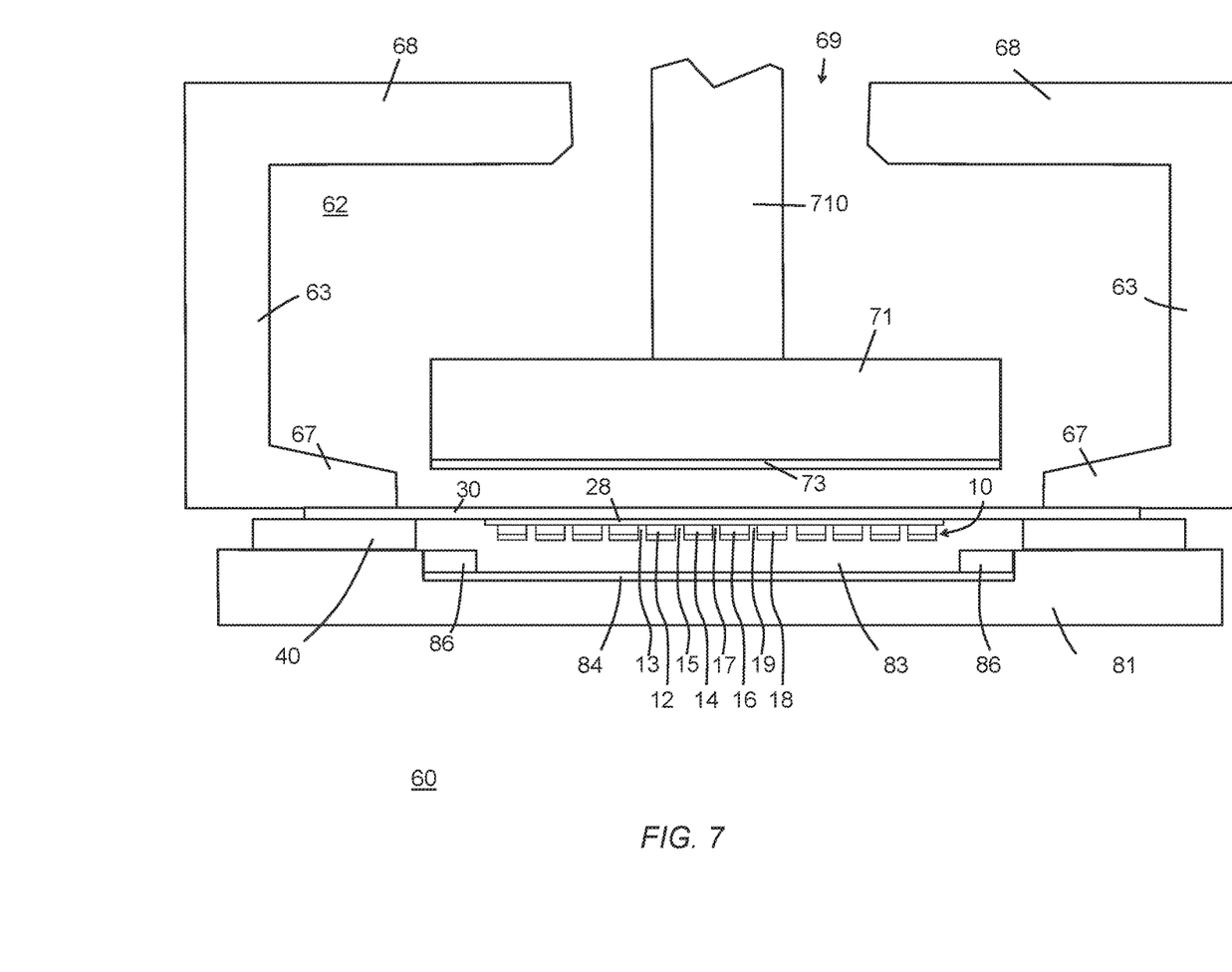
FIGS. 7-12 illustrates a cross-sectional views of a back layer separation apparatus at various steps in a method for separating or singulating a back layer in accordance with an example of the present description.

FIG. 7 illustrates a cross-sectional view of a back layer separation apparatus 60 at an early step in a back layer singulation or separation process. In one example, apparatus 60 is configured to hold wafer 10 including frame 40 and carrier tape 30. In some examples, separation apparatus 60 can be configured to process a single wafer and to provide a back layer separation process where layer 28 on wafer 10 is separated substantially at the same time (that is, batch separated) compared to other processes that separate only a localized portion of layer 28 at a time. In other examples, separation apparatus 60 can be configured to process multiple wafers in a similar manner, but in a batch configuration (e.g., multiple wafers processed at once).

Apparatus 60 can include a chamber 62, such as a compression chamber 62 sized to accommodate wafer 10 and frame 40 depending upon the sizes of such structures. For example, chamber 62 can be configured to accommodate various wafer diameters including 100 mm, 150 mm, 200 mm, 300 mm, 450 mm, etc. In one example, chamber 62 can be bounded on all sides by a plurality of generally vertical sidewalls 63 that extend generally upward from a lower chamber wall or surface 67. Sidewalls 63 can be attached to lower chamber wall 67 using any suitable attachment devices, or sidewalls 63 and lower chamber wall 67 may be of integral construction. In some examples, chamber 62 further includes an upper chamber wall or surface 68, which can include an opening 69 to accommodate a work piece 71 or plate structure 71, such as a compression structure 71 or transfer plate 71, or, in some examples, to provide an entrance for a non-compressible fluid. Chamber 62 and can be any suitable shape appropriate for processing wafer 10 and frame 40 or other processing, holding, and/or transferring structures. In another example, apparatus 60 can be provided without sidewalls 63 and upper chamber wall 68 and instead is provided with lower chamber wall 67 configured as, for example, a hold-down structure for maintaining frame 40 substantially stationary. In most examples, chamber 62 comprises a rigid material, such as metals, composite materials, or other suitable materials as known to those skilled in the art. In one preferred example, chamber 62 comprises stainless steel.

In accordance with the present example, apparatus 60 is further provided with a support structure 81 or thermal processing structure 81 having a recess 83, reservoir 83, such as a fluid reservoir 83 configured to enclose or contain a thermal transfer medium, which will be described in more detail later. In some examples, a protective coating 84 or protective film 84 is provided along at least a portion of the lower surface of recess 83. In some examples, protective film 84 comprises a synthetic resin material. In some examples, protective film 84 can be a demountably attached film that can be replaced at selected intervals. In other examples, protective film 84 can be a more permanent film deposited onto surfaces of recess 83. Protective film 84 can be configured to protect wafer 10 during the separation or singulation of back layer 28. In some examples, support structure 81 comprises a material suitable for containing cryogenic fluids and suitable for efficient thermal transfer to recess 83 and provide a suitable low friction surface. In some examples, support structure 81 comprises a stainless steel or other metal alloy materials.

In some examples, a ring structure 86 or edge structure 86 is disposed along perimeter surfaces of recess 83. In accordance with the present example, edge structure 86 comprises a compressible material or a material that deforms or shortens in a direction of an applied load. In some examples, edge structure 86 comprises one or more cross-link polymer materials that exhibit high elastic deformation. In the present example, edge structure 86 is configured to deform to provide space for the thermal transfer medium to expand into during the separation or singulation of back layer 28.

In some examples, transfer plate 71 is movably associated or attached within chamber 62 and adapted to physically move or transfer carrier substrate 30 and wafer 10 into recess 83 during the separation of back layer 28. In some examples, transfer plate 71 has a width that is greater than or equal to the width of wafer 10 to ensure efficient transfer of wafer 10. In one example, transfer plate 71 includes a protective coating 73 or a protective film 73 disposed on at least a surface of transfer plate 71 that is proximate to or facing carrier substrate 30 and wafer 10. In some examples, protective film 73 comprises a synthetic resin material. In some examples, protective film 73 can be a demountably attached film that can be replaced at selected intervals. In other examples, protective film 73 can be a more permanent film deposited onto surfaces of transfer plate 71. Protective film 73 can be configured to protect carrier substrate 30 and wafer 10 during the separation or singulation of back layer 28 and provide a suitable low friction surface. In some examples, a shaft 710 is engaged with or attached to transfer plate 71, which is configured to move transfer plate 71 towards and away from wafer 10 during subsequent processing of wafer 10.

Figure 8:
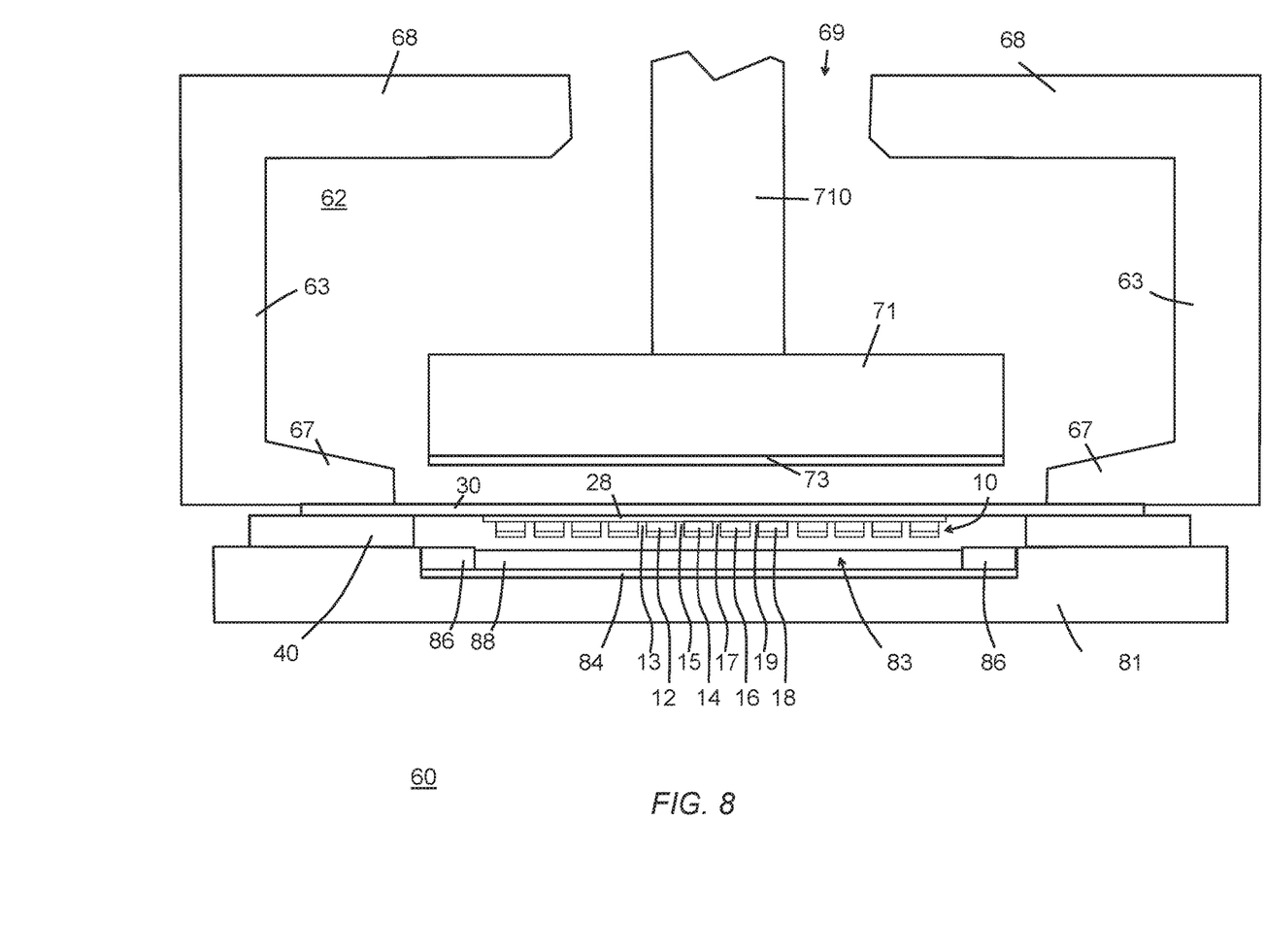

FIG. 8 illustrates a cross-sectional view of back layer separation apparatus 60 including wafer 10 and carrier substrate 30 at a later step of the back layer singulation or separation process. In one example, a thermal transfer medium 88 is provided within recess 83. In some examples, thermal transfer medium 88 initially comprises a fluid. In some examples, thermal transfer medium initially comprises a liquid, such as deionized water or deaerated water. In one example, thermal transfer medium 88 comprises chilled deionized water. For example, thermal transfer medium 88 initially comprises deionized water at a temperature in range from about 2 degrees Celsius to about 8 degrees Celsius. In one example, the deionized water is provided at a temperature of about 4 degrees Celsius. In some examples, thermal transfer medium 88 comprises one or more materials that can be provided initially in a first state, for example, a liquid state, and that change to a second state, for example, a solid state, upon exposure to a thermal response. In some examples, the second state is characterized as a state configured to exert a force, such as a lateral force on wafer 10 to expand the gaps (for example, singulation lines 13, 15, 17, and 19) between adjacent die (for example, die 12, 14, 16, and 18) on wafer 10 without causing damage to the die.

Figure 9:
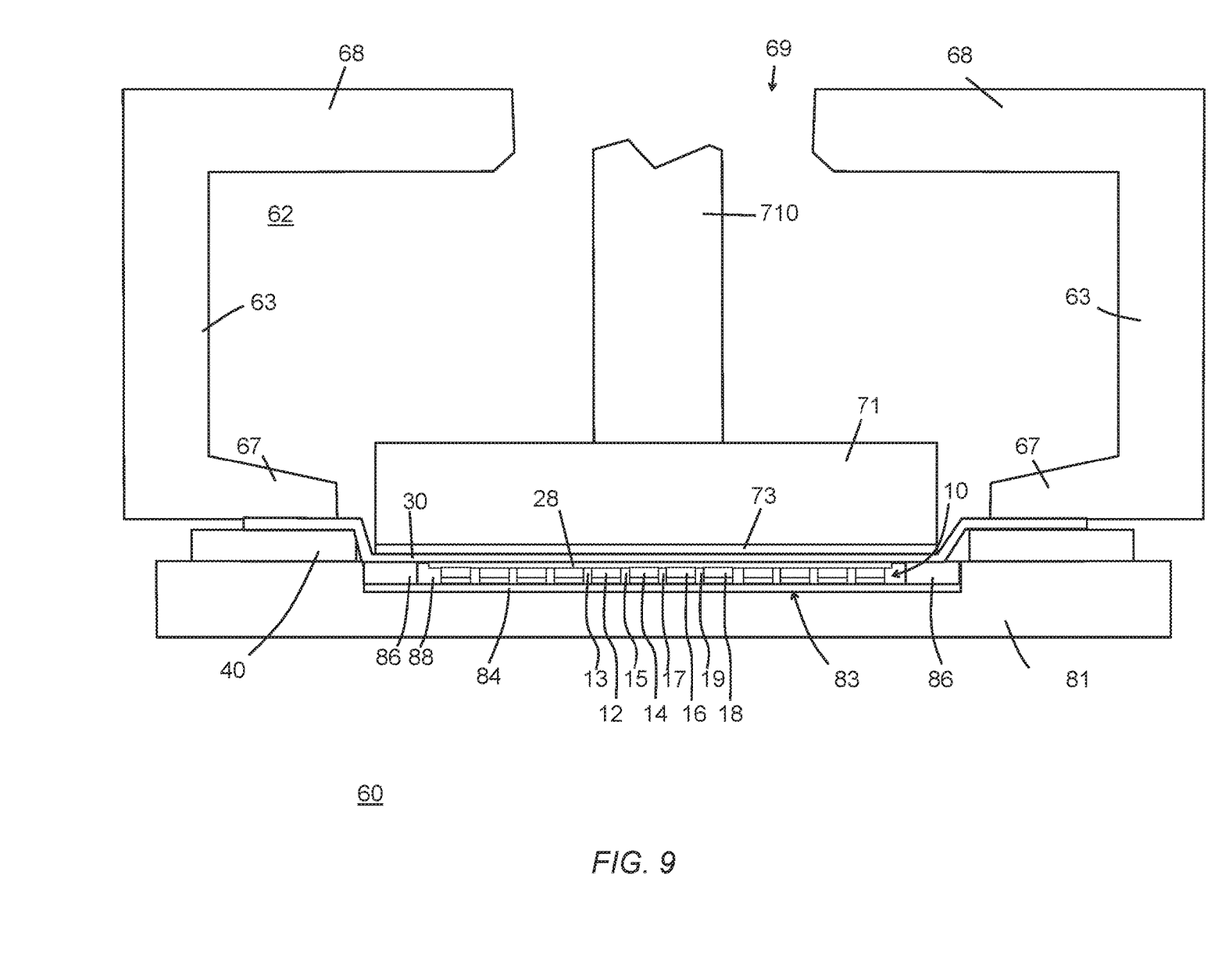

FIG. 9 illustrates a cross-sectional view of back layer separation apparatus 60 including wafer 10 and carrier substrate 30 at a further step of the back layer singulation or separation process. In one example, transfer plate 71 can be used to move carrier substrate 30 and wafer 10 downward into thermal transfer medium 88. In some examples, transfer plate 71 can be used to move carrier substrate 30 and wafer 10 such that least back layer 28 is immersed within thermal transfer medium 88. In some examples, the surface of back layer 28 distal to major surface 22 of bulk substrate 11 is below the upper surface of thermal transfer medium 88. In some examples, the front side of wafer 10 (that is, the side distal to back layer 28) physically contacts protective film 84. As a result of this step in the back layer singulation or separation process, die 12, 14, 16, and 18 are surrounded by thermal transfer medium 88. As set forth previously, in one example, thermal transfer medium 88 can comprise deionized water at a temperature in range from about 2 degrees Celsius to about 8 degrees Celsius at this step in the process.

Figure 10:
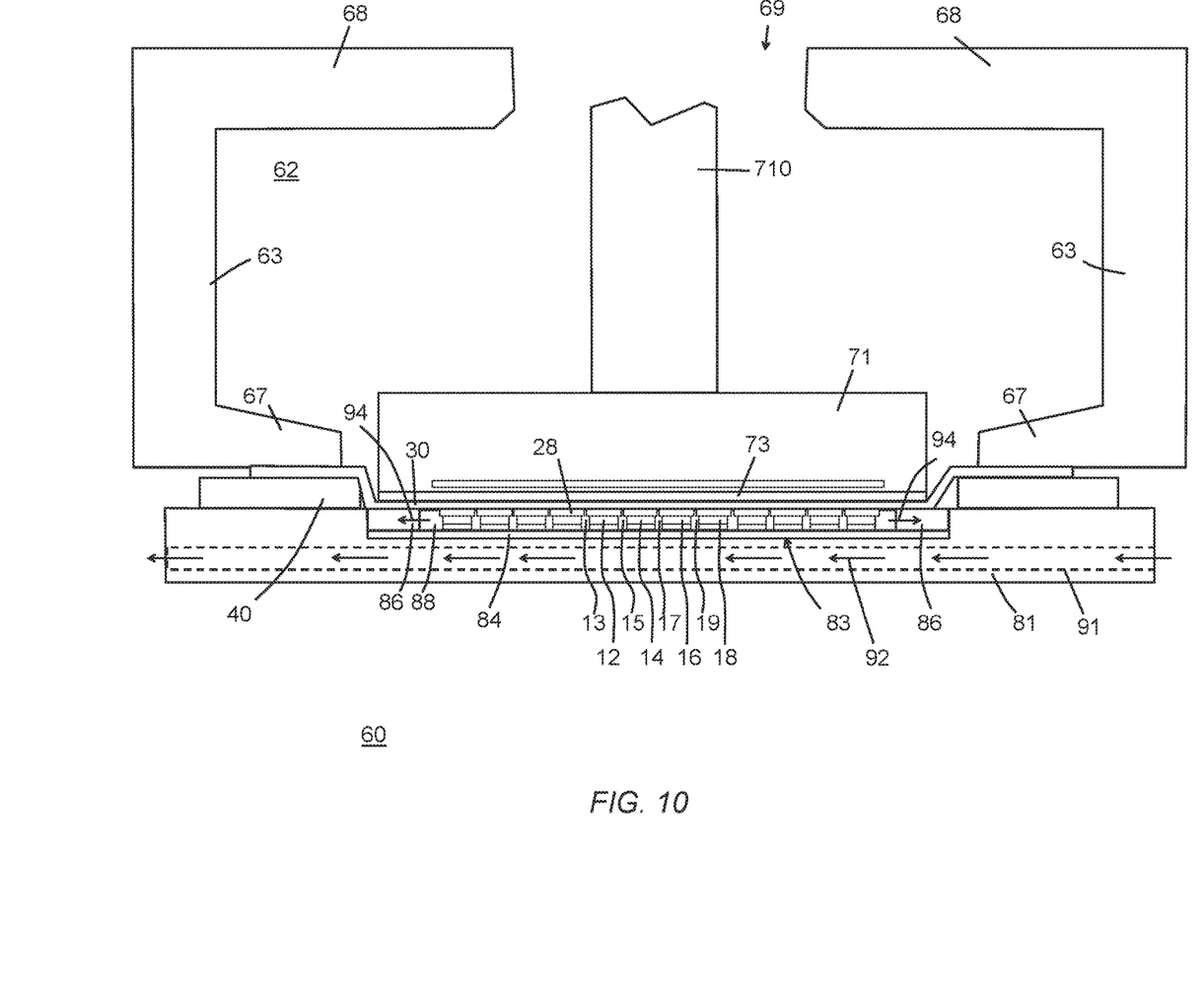

FIG. 10 illustrates a cross-sectional view of back layer separation apparatus 60 including wafer 10 and carrier substrate 30 at a still further step of the back layer singulation or separation process. In one example, thermal transfer medium 88 is exposed to a reduced temperature thereby changing the state of thermal transfer medium from a first state, such as a liquid state, to a second state, such as a solid state. In one example, a cryogenic fluid (represented by arrows 92) can be passed through a duct or channel 91 embedded within support structure 81 that is placed proximate to recess 83 thereby reducing the temperature of thermal transfer medium 88. In some examples, the cryogenic fluid freezes thermal transfer medium 88. By way of example, cryogenic fluids, such as those having a boiling point below approximately 112 degrees Kelvin can be used to freeze thermal transfer medium 88. In one example, liquid nitrogen can be used to freeze thermal transfer medium 88. In other examples, liquid air, liquid fluorine, liquid argon, or other cryogenic fluids can be used. In other examples, cryogenic gases can be used. In another example, other methods, such as thermoelectric cooling techniques (e.g., a Peltier cooling device), can be used. In some examples, layer of material 28 is exposed to a temperature below approximately minus (−) 150 degrees Celsius. It is understood that back layer separation apparatus 60 is further configured to include appropriate containment and transfer structures (not shown) suitable for cryogenic materials.

In accordance with the present example, during the transition to the second state, the freezing thermal transfer medium 88 expands the gaps or singulation lines 13, 15, 17, and 19 between the die to break or separate any remaining portions of bulk substrate 11 and portions of back layer 28 adjacent singulation lines 13, 15, 17, and 19. In some examples, transfer plate 71, the lower surface of recess 83 and protective layer 84 are configured to restrain wafer 10 in a first direction, such as a vertical direction (i.e., vertically confine), which results in wafer 10 expanding in a second direction, such as a lateral direction or horizontal (represented generally by arrows 94) during this step. Edge structure 86 is configured to absorb the lateral movement of thermal transfer medium 88 and wafer 10. In some examples, the width of singulation lines 13, 15, 17, and 19 is increased by approximately 10% during this step. Those skilled in the art will recognize that other means can be used to change the state of thermal transfer medium 88.

Figure 11:
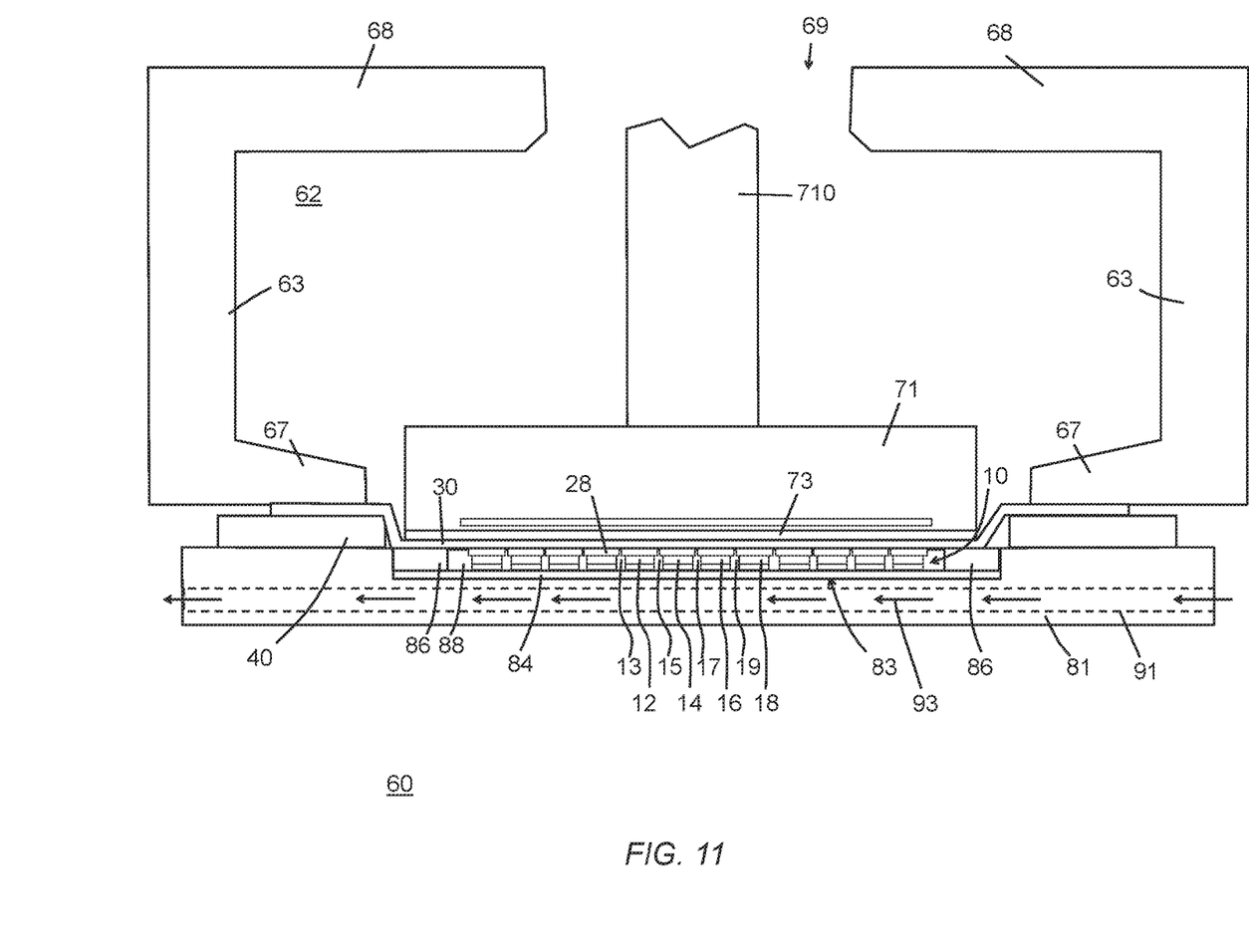

FIG. 11 illustrates a cross-sectional view of back layer separation apparatus 60 including wafer 10 and carrier substrate 30 at an additional step of the back layer singulation or separation process. In one example, thermal transfer medium 88 is transitioned from the second state back to the first state. In some examples, heat is used to melt thermal transfer medium 88 back to liquid form. In some examples, hot air (represented by arrows 93) is transported through duct 92 to transition thermal transfer medium 88 to the first state. In other examples, resistive heating elements or other heating techniques can be used for this step. In one example, after this step die 12, 14, 16, and 18 are immersed in melted deionized water.

Figure 12:
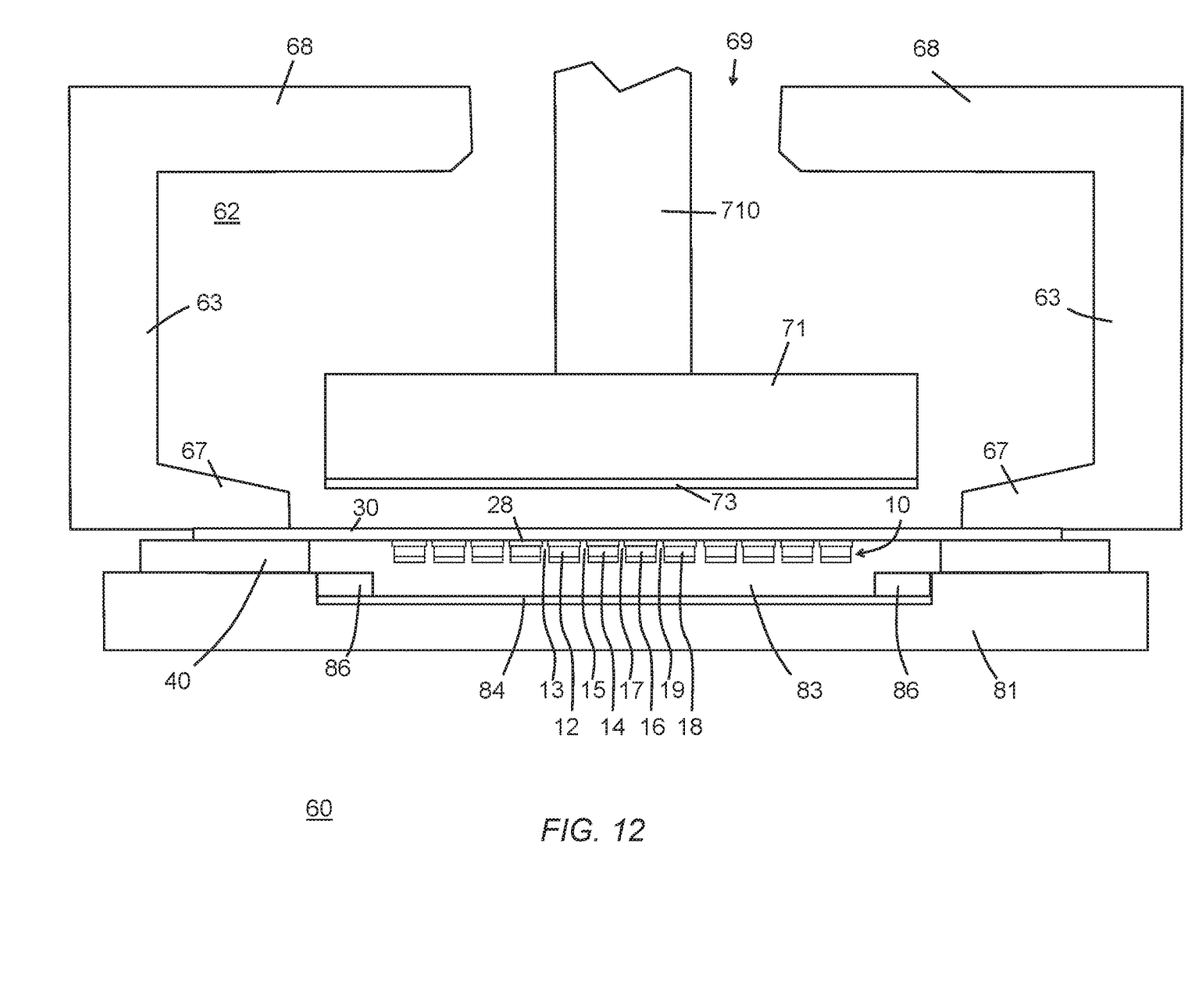

FIG. 12 illustrates a cross-sectional view of back layer separation apparatus 60 including wafer 10 and carrier substrate 30 at an additional step of the back layer singulation or separation process. In one example, transfer plate 71 is moved away from carrier substrate 30 and wafer 10, thermal transfer medium 88 can be removed from recess 83, frame 40 is released from apparatus 60, and the singulated wafer 10 can then be cleaned and dried. In subsequent processing, die 12, 14, 16, and 18 can be removed from carrier substrate 30 and packaged in accordance with specified assembly requirements. In other examples, wafer 10 can be rinsed and dried within apparatus 60 prior to its removal for subsequent processing.

In other examples, wafer 10 and carrier substrate 30 can be inverted such that carrier substrate 30 is provided adjoining the bottom of recess 83 and wafer 10 adjoins transfer plate 71. In some examples, wafer 10 and layer of material 28 are completely immersed within thermal transfer medium 88.

From all of the foregoing, one skilled in the art can determine that, according to another example, a method for separating a continuous layer of material disposed on a major surface of a singulated bulk substrate comprises exposing the layer of material to a reduced temperature using a cryogenic fluid.

From all of the foregoing, one skilled in the art can determine that, according to a further example, a method for separating a continuous layer of material disposed on a major surface of a singulated bulk substrate comprises placing the layer of material into a fluid; and exposing the fluid and the layer of material to a cryogenic temperature while the bulk substrate is constrained in one direction, wherein the cryogenic temperature causes the bulk substrate to move in another direction thereby separating the layer of material within singulation lines.

From all of the foregoing, one skilled in the art can determine that, according to a further example, a method of singulating a wafer comprises exposing the fluid and the layer of material to a cryogenic temperature while the bulk substrate is constrained in one direction, wherein the cryogenic temperature causes the bulk substrate to move in another direction thereby separating the layer of material within singulation lines. The method includes placing the wafer onto a carrier substrate and singulating the wafer through the spaces to form singulation lines, wherein singulating comprises stopping in proximity to the layer of material. The method includes placing the wafer into a chamber having a compression structure and a support structure and exposing the layer of material to a cryogenic temperature while the wafer is vertically constrained by the compression structure and the support structure thereby laterally expanding the spaces between the die to separate the layer of material in the singulation lines.

In another example, exposing comprises exposing the layer of material comprises using liquid nitrogen (LN$_2$). In a further example, the method comprises heating the wafer after the exposing step. In a still further example, placing the wafer into the chamber comprises providing the support structure with a fluid reservoir. In another example, the method can further comprise filling the fluid reservoir with a fluid; and moving the compression structure against the wafer thereby placing the wafer and layer of material into the chilled fluid before the step of exposing the layer of material to the cryogenic temperature range. In another example, the method can further comprise removing the fluid from the fluid reservoir after the exposing step. In some examples, the carrier substrate comprises a carrier tape. In some example, the carrier substrate is added to the substrate after the removal step, for example when only portions of the bulk substrate are remove to form the gaps.

In view of all of the above, it is evident that a novel method and associated apparatus are disclosed. Included, among other features, is providing a substrate having die formed as part of the substrate and separated from each other by spaces, wherein the substrate has first and second opposing major surfaces, and wherein a layer of material is formed atop the second major surface. The substrate is placed onto a carrier substrate and portions of the substrate are removed through the spaces to form gaps between adjoining die. The gaps extend at least partially through the substrate towards the second major surface. The layer of material is exposed to a reduced temperature while the substrate is constrained in a first direction between a plate structure and a support structure. The exposing step expands the gaps between the adjoining die in a second direction to separate at least portions of the layer of material. In another example, the exposing step comprises exposing using a cryogenic fluid. The method and associated apparatus provide a process for batch separating a whole substrate in a cost effective manner. In addition, the method and associated apparatus enable batch separation for more challenging type of back layer materials, such a wafer-back-coating materials (WBC), thick metal layers (e.g., greater than 20 microns thick), and die attach films (DAF) among others. Further, the method and associated apparatus support narrower scribe grids, support partial singulation methods, reduce the present of back layer fillet structures, and support a variety of substrate materials including, for example, silicon carbide substrate.

While the subject matter of the description is described with specific preferred examples and example examples, the foregoing drawings and descriptions thereof depict only typical examples of the subject matter, and are not therefore to be considered limiting of its scope. It is evident that many alternatives and variations will be apparent to those skilled in the art. For example, other forms of removable support materials can be used instead of carrier tapes.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the description. Furthermore, while some examples described herein include some but not other features included in other examples, combinations of features of different examples are meant to be within the scope of the description and meant to form different examples as would be understood by those skilled in the art.

What is claimed is:

1. A method of processing a substrate, comprising:
   providing a substrate having die formed as part of the substrate and separated from each other by spaces, wherein the substrate has first and second opposing major surfaces, and wherein a layer of material is formed atop the second major surface;
   placing the substrate onto a carrier substrate;
   removing portions of the substrate through the spaces to form gaps between adjoining die, wherein the gaps extend at least partially through the substrate towards the second major surface; and
   separating at least portions of the layer of material by exposing the layer of material to a reduced temperature while the substrate is constrained in a first direction between a plate structure and a support structure, wherein the exposing step expands the gaps between the adjoining die in a second direction.

2. The method of claim 1, wherein removing portions of the substrate comprises plasma etching the substrate and stopping in proximity to the layer of material.

3. The method of claim 1, wherein removing portions of the substrate comprises removing at least 50% of the substrate in the gaps.

4. The method of claim 1, wherein exposing the layer of material comprises:
   providing a chamber comprising the plate structure and the support structure, the support structure comprising a recess;
   placing the substrate within the recess;
   providing a thermal transfer medium within the recess; and
   exposing the thermal transfer medium to the reduced temperature thereby transitioning the thermal transfer medium from a first state to a second state.

5. The method of claim 4, wherein:
   providing the thermal transfer medium comprises providing a liquid; and
   exposing comprises freezing the liquid.

6. The method of claim 5, wherein:
   providing the liquid comprises providing water.

7. The method of claim 5, wherein:
   providing the support structure comprises providing an edge structure within the recess configured to deform to provide space for the thermal transfer medium to expand into during the exposing step.

8. The method of claim 1 further comprising heating the substrate after the exposing step.

9. The method of claim 1, wherein exposing comprises using a cryogenic fluid.

10. The method of claim 1, wherein:
    providing the substrate comprises providing a semiconductor wafer; and
    providing the layer of material comprises providing layer of material comprising a metal; and
    exposing the layer of material comprises exposing to a temperature below about minus 150 degrees Celsius.

11. A method of processing a substrate, comprising:
    providing a substrate having die formed as part of the substrate and separated from each other by spaces, wherein the substrate has first and second opposing major surfaces, and wherein a layer of material is formed atop the second major surface;
    placing the substrate onto a carrier substrate;
    removing portions of the substrate through the spaces to form gaps between adjoining die, wherein the gaps extend at least partially through the substrate towards the second major surface; and
    separating at least portions of the layer of material by exposing the layer of material to a reduced temperature while the substrate is constrained in a first direction, wherein the exposing step expands the gaps between the adjoining die in a second direction.

12. The method of claim 11, wherein exposing comprises:
    providing a plate structure and a support substrate having a recess;
    placing at least the layer of material within the recess;

using the plate structure to constrain the substrate in the first direction;

providing a thermal transfer medium within the recess; and exposing the thermal transfer medium to the reduced temperature thereby transitioning the thermal transfer medium from a first state to a second state.

13. The method of claim 12, wherein:

providing the thermal transfer medium comprises providing a liquid; and exposing comprises freezing the liquid.

14. The method of claim 12, wherein:

providing the support structure comprises providing an edge structure within the recess configured to deform to provide space for the thermal transfer medium to expand into during the exposing step.

15. The method of claim 11 further comprising heating substrate after the exposing step.

16. The method of claim 11, wherein:

providing the substrate comprises providing a semiconductor wafer; and providing the layer of material comprises providing layer of material comprising a metal; and exposing comprises using a cryogenic liquid.

17. A method of processing a substrate comprising:

providing a substrate having die formed as part of the substrate and separated from each other by spaces, wherein the substrate comprises first and second opposing major surfaces, and wherein a layer of material is formed atop the second major surface;

placing the substrate onto a carrier substrate;

removing at least portions of the substrate within the spaces to form gaps between adjoining die;

providing an apparatus comprising a plate structure and a support structure including a recess; and separating at least portions of the layer of material by exposing the layer of material to a reduced temperature using a cryogenic fluid while the substrate is constrained in a first direction between the plate structure and the support structure, wherein the exposing step expands the gaps between the adjoining die in a second direction.

18. The method of claim 17, wherein exposing comprises:

providing a thermal transfer medium within the recess; and exposing the thermal transfer medium to the reduced temperature thereby transitioning the thermal transfer medium from a first state to a second state.

19. The method of claim 18, wherein:

providing the thermal transfer medium comprises providing a liquid; and exposing comprises freezing the liquid.

20. The method of claim 17, wherein:

providing the substrate comprises providing a semiconductor wafer;

providing the layer of material comprises providing layer of material comprising a metal;

providing the support structure comprises providing an edge structure within the recess configured to deform to provide space for the thermal transfer medium to expand into during the exposing step;

providing the support structure comprises providing a protective layer on a surface of the recess that adjoins the substrate; and the method further comprises heating substrate after the exposing step.

* * * * *